US007430486B2

(12) United States Patent
Elston et al.

(10) Patent No.: US 7,430,486 B2
(45) Date of Patent: Sep. 30, 2008

(54) DATALOG SUPPORT IN A MODULAR TEST SYSTEM

(75) Inventors: Mark Elston, Salinas, CA (US); Ankan Pramanick, San Jose, CA (US)

(73) Assignee: Advantest America R&D Center, Inc., Santa Clara, CA (US)

( * ) Notice: Subject to any disclaimer, the term of this patent is extended or adjusted under 35 U.S.C. 154(b) by 411 days.

(21) Appl. No.: 10/917,821

(22) Filed: Aug. 13, 2004

(65) Prior Publication Data

US 2005/0262414 A1    Nov. 24, 2005

Related U.S. Application Data

(60) Provisional application No. 60/573,577, filed on May 22, 2004.

(51) Int. Cl.
*G06F 11/26* (2006.01)
*G06F 11/00* (2006.01)

(52) U.S. Cl. .................. 702/108; 702/119; 714/742

(58) Field of Classification Search ................ 702/108, 702/119
See application file for complete search history.

(56) References Cited

U.S. PATENT DOCUMENTS

| 4,807,161 A | 2/1989 | Comfort et al. ............. 702/121 |
| 5,181,201 A | 1/1993 | Schauss et al. |
| 5,488,573 A | 1/1996 | Brown et al. ................ 707/21 |
| 5,668,745 A * | 9/1997 | Day ......................... 702/121 |
| 5,892,949 A | 4/1999 | Noble ........................ 717/125 |
| 6,028,439 A | 2/2000 | Arkin et al. ................ 724/765 |
| 6,195,774 B1 | 2/2001 | Jacobson .................... 714/727 |
| 6,405,364 B1 | 6/2002 | Bowman-Amuah ......... 717/101 |
| 6,427,223 B1 | 7/2002 | Kim et al. .................... 716/4 |
| 6,601,018 B1 | 7/2003 | Logan ......................... 702/186 |
| 6,779,170 B1 | 8/2004 | Montrym |
| 6,868,513 B1 | 3/2005 | Botala et al. |
| 2002/0059561 A1 | 5/2002 | Foster et al. |

(Continued)

FOREIGN PATENT DOCUMENTS

DE    10031536 A1    1/2001

(Continued)

OTHER PUBLICATIONS

Chang, E. et al. (1998). "A Scalable Architecture for VLSI Test," *IEEE, Proceedings International Test Conference 1998*, Washington, DC. Paper 20.2, pp. 500-506, no month.

(Continued)

*Primary Examiner*—Hal D Wachsman
(74) *Attorney, Agent, or Firm*—Morrison & Foerster LLP

(57) ABSTRACT

A method for communicating test information from a source to a destination is disclosed. The method includes providing a modular test system, where the modular test system comprises a system controller for controlling at least one site controller, the at least one site controller for controlling at least one test module. The method further includes providing a datalog framework for supporting extension of user-defined datalog formats, providing support classes for supporting user-initiated datalog events, receiving a datalog event requesting for communicating input test information from the source to the destination, configuring output test information based upon the destination, the datalog framework and the support classes, and transferring the output test information to the destination.

14 Claims, 9 Drawing Sheets

U.S. PATENT DOCUMENTS

| | | | |
|---|---|---|---|
| 2002/0073374 A1* | 6/2002 | Danialy et al. | 714/738 |
| 2002/0073375 A1 | 6/2002 | Hollander | 714/739 |
| 2003/0005375 A1 | 1/2003 | Krech, Jr. et al. | 714/724 |
| 2003/0208747 A1* | 11/2003 | Kim et al. | 717/131 |
| 2003/0217343 A1 | 11/2003 | Rajsuman et al. | 716/4 |
| 2004/0193990 A1* | 9/2004 | Ichiyoshi | 714/742 |
| 2004/0210798 A1* | 10/2004 | Higashi | 714/27 |
| 2004/0225459 A1 | 11/2004 | Krishnaswamy et al. | 702/57 |
| 2004/0225465 A1* | 11/2004 | Pramanick et al. | 702/119 |
| 2005/0022087 A1 | 1/2005 | Pramanick et al. | 714/742 |
| 2005/0039079 A1* | 2/2005 | Higashi et al. | 714/28 |
| 2005/0154551 A1 | 7/2005 | Pramanick et al. | 702/119 |

FOREIGN PATENT DOCUMENTS

| | | |
|---|---|---|
| WO | WO-2004/072669 A1 | 8/2004 |
| WO | WO-2004/072670 A1 | 8/2004 |

OTHER PUBLICATIONS

Conti, D. R. (2002). "Mission Impossible? Open Architecture ATE," *IEEE, Proceedings International Test Conference 2002*, Washington, DC. Panel 5.1, p. 1207, no month.

Evans, A.C. (1999). "Applications of Semiconductor Test Economics, and Multisite Testing to Lower Cost of Test," *IEEE, Proceedings International Test Conference 1999*, Washington, DC. Paper 5.2, pp. 113-123, no month.

Mirizzi, D.J. et al. (1993). "Implementation of Parrellelsite Test on an 8-Bit Configurable Microcontroller," *IEEE, Proceedings International Test Conference 1993*, Washington, DC. Paper 8.3, pp. 226-235, no month.

Perez, S.M. (2002). "The Consequences of an Open ATE Architecture," *IEEE, Proceedings International Test Conference 2002*, Washington, DC. Panel P5.4, p. 1210, no month.

Schoettmer, U. et al. (1995). "Challenging the 'High Performance—High Cost' Paradigm in Test," *IEEE, Proceedings International Test Conference 1995*, Washington, DC. Paper 37.1, pp. 870-879, no month.

Simpson, W.R. (1995). "Cutting the Cost of Test; the Value-added Way," *IEEE, Proceedings International Test Conference 1995*, Washington, DC. Paper 41.2, p. 921, no month.

West, B.G. (2002). "Open ATE Architecture: Key Challenges," *IEEE, Proceedings International Test Conference 2002*, Washington, DC. Panel P5.6, p. 1212, no month.

Fan, D. et al. (2003). "Case Study—Using STIL as Test Pattern Language," *NPTest, Inc. LLC*, ITC International Test Conference, 32:3, pp. 811-817, no month.

Fan, D. et al. (2003). "Case Study—Using STIL as Test Pattern Language," *NPTest, Inc. LLC, ITC International Test Conference*, 32:3, pp. 811-817.

International Search Report mailed on Aug. 8, 2005 for PCT Application No. PCT/JP2005/009810 filed on May 23, 2005, 4 pages.

Perez, S.M. et al. (Jul. 16, 2003). "Open Architecture Test System: The New Frontier," *28th IEEE/CPMI/SEMI International Electronics Manufacturing Technology Symposium*, San Jose, CA, Jul. 16-18, 2003, pp. 211-214.

Portelli, B. et al. (May 22, 1989). "Demonstration of Avionics Module Exchangeability via Simulation (DAMES) Program Overview," *Proceedings of the IEEE 1989 Natl Aerospace and Elect. Conf. (NAECON 1989)*, Dayton, OH, vol. 2:660-667.

Rajsuman, R.(Jan. 30, 2004). "An Overview of the Open Architecture Test System," *Proceedings of the 2nd IEEE Intl Workshop on Elect. Design, Test, and Applications (Delta'04)*, pp. 1-6.

Semiconductor Test Consortium. "ATE Open Architecture Initiative," (Oct. 8, 2002). located at <http://www.semitest.org/site/News/News_Files/file_news2> last visited on Mar. 8, 2006, 12 pages.

European Office Action mailed on Mar. 8, 2007, for EP Application No. 05743357.5 filed on May 23, 2005, 6 pages.

International Search Report mailed on Jun. 23, 2004, for PCT Application No. PCT/JP2004/001649 filed on Feb. 16, 2004, 4 pages.

International Search Report mailed on Aug. 8, 2005 for PCT Application No. PCT/JP2005/009811 filed on May 23, 2005, 5 pages.

International Search Report mailed on Aug. 8, 2005 for PCT Applicaton No. PCT/JP2005/009815 filed on May 23, 2005, 5 pages.

International Search Report mailed on Sep. 16, 2005 for PCT Application No. PCT/JP2005/009809 filed on May 23, 2005, 4 pages.

International Search Report mailed on Feb. 16, 2006 for PCT Application No. PCT/JP2005/009813 filed on May 23, 2005, 5 pages.

International Search Report mailed on Feb. 16, 2006 for PCT Application No. PCT/JP2005/009816 filed on May 23, 2005, 6 pages.

* cited by examiner

DATALOG SUPPORT IN A MODULAR TEST SYSTEM

CROSS-REFERENCE TO RELATED APPLICATIONS

This application claims the benefit of provisional application No. 60/573,577, "Software Development in an Open Architecture Test System," filed by Advantest Corporation on May 22, 2004, which is incorporated herein in its entirety by reference.

FIELD OF THE INVENTION

The present invention relates to the field of automated test equipment (ATE). In particular, the present invention relates to a method and system for supporting datalog in an open architecture test system.

BACKGROUND OF THE INVENTION

The increasing complexity of System-on-a-Chip (SOC) devices and the simultaneous demand for a reduction in the cost of chip testing has forced both integrated circuit (IC) manufacturers and tester vendors to rethink how IC testing should be performed. According to industry studies, without re-engineering the projected cost of testers will continue to rise dramatically in the near future.

A major reason for the high cost of test equipment is the specialized nature of conventional tester architecture. Each tester manufacturer has a number of tester platforms that are not only incompatible across companies such as Advantest, Teradyne and Agilent, but also incompatible across platforms within a company, such as the T3300, T5500 and T6600 series testers manufactured by Advantest. Because of these incompatibilities, each tester requires its own specialized hardware and software components, and these specialized hardware and software components cannot be used on other testers. In addition, a significant effort is required to port a test program from one tester to another, and to develop third party solutions. Even when a third party solution is developed for a platform, it cannot be ported or reused on a different platform. The translation process from one platform to another is generally complex and error prone, resulting in additional effort, time and increased test cost.

Datalogging is used to provide status information to the user when running a test or a series of tests. The information reported in a datalog may include the pass/fail status of the device under test (DUT), any relevant measured parameters, and the overall run status of the test itself. This information is typically used offline to assess the completion of a test run and the performance of the device being tested. The support of datalog capabilities allows users to output their test information from a designated source to a designated destination in a desired format.

One of the problems of the specialized tester architecture is that all hardware and software remain in a fixed configuration for a given tester. To test a hardware device or an IC, a dedicated test program is developed that uses some or all of the tester capabilities to define the test data, signals, waveforms, and current and voltage levels, as well as to collect the DUT response and to determine DUT pass/fail.

Since a test system needs to exercise a wide range of functionalities and operations in order to test a wide variety of test modules and their corresponding DUTs, there is a need for an open architecture test system that can be configured to support the wide variety of test modules. Specifically, in order to support the wide variety of test modules, there is a need for a datalog framework within the open architecture test system that can be configured to work with the different formats of the different sources and destinations of the test system.

SUMMARY

In one embodiment of the present invention, a method for communicating test information from a source to a destination includes providing a modular test system, where the modular test system comprises a system controller for controlling at least one site controller, the at least one site controller for controlling at least one test module. The method further includes providing a datalog framework for supporting extension of user-defined datalog formats, providing support classes for supporting user-initiated datalog events, receiving a datalog event requesting for communicating input test information from the source to the destination, configuring output test information based upon the destination, the datalog framework and the support classes, and transferring the output test information to the destination.

In another embodiment of the present invention, a modular test system includes a system controller, at least one site controller coupled to the system controller, at least one test module and its corresponding device under test (DUT), a datalog framework configured to support extension of user-defined datalog formats, and one or more support classes configured to support user-initiated datalog events. The modular test system further includes means for receiving a datalog event requesting for communicating input test information from the source to the destination, means for configuring output test information based upon the destination, the datalog framework and the support classes, and means for transferring the output test information to the destination.

BRIEF DESCRIPTION OF THE DRAWINGS

The aforementioned features and advantages of the invention as well as additional features and advantages thereof will be more clearly understood hereinafter as a result of a detailed description of embodiments of the invention when taken in conjunction with the following drawings.

DESCRIPTION OF EMBODIMENTS

Methods and systems are provided for datalog support in a modular test system. The following description is presented to enable any person skilled in the art to make and use the invention. Descriptions of specific techniques and applications are provided only as examples. Various modifications to the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 1:
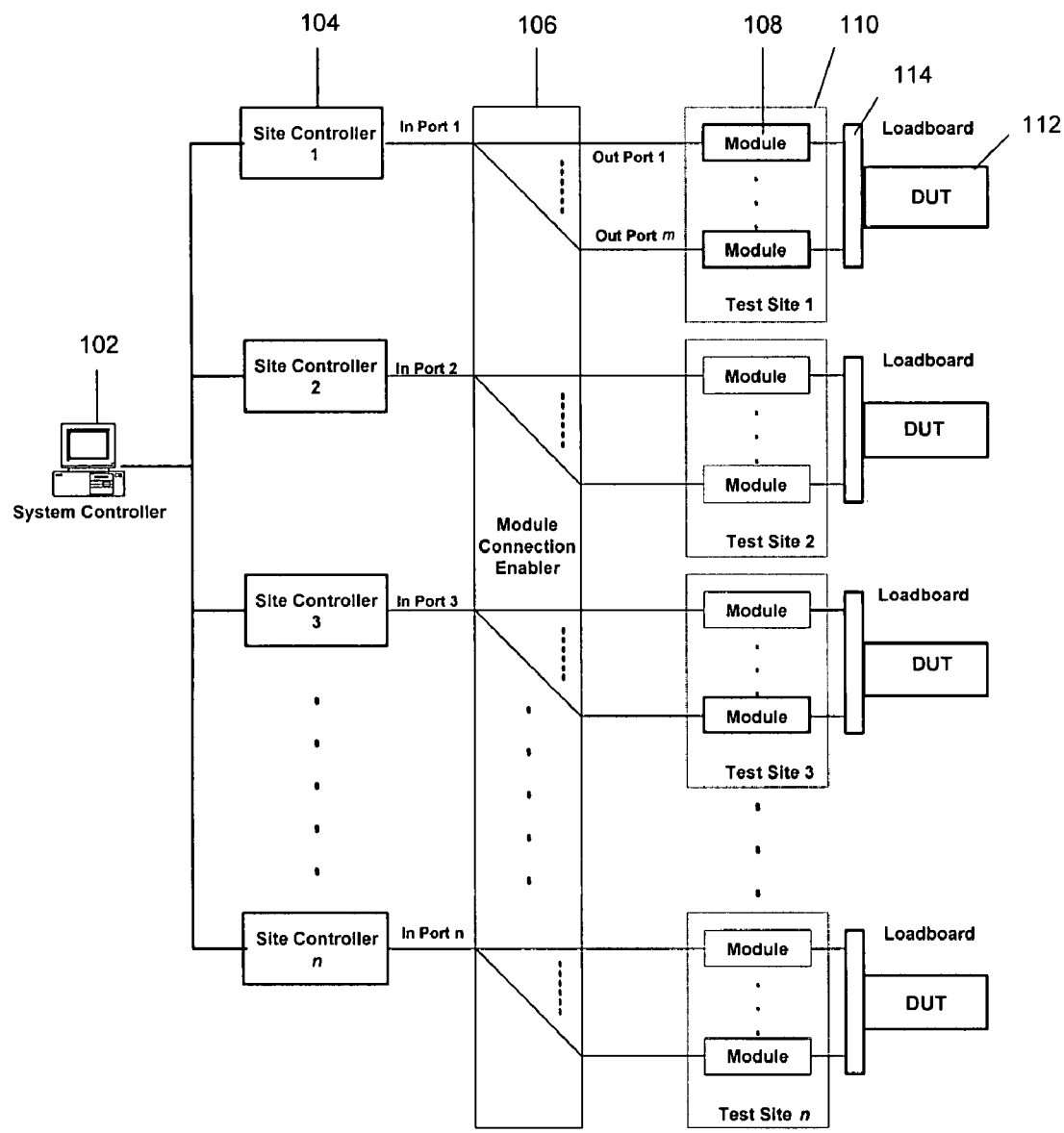
FIG. 1 illustrates an open architecture test system according to an embodiment of the present invention.

FIG. 1 illustrates an open architecture test system according to an embodiment of the present invention. A system controller (SysC) 102 is coupled to multiple site controllers (SiteCs) 104. The system controller may also be coupled to a network to access associated files. Through a module connection enabler 106, each site controller is coupled to control one or more test modules 108 located at a test site 110. The module connection enabler 106 allows reconfiguration of connected hardware modules 108 and also serves as a bus for data transfer (for loading pattern data, gathering response data, providing control, etc.). In addition, through the module connection enabler, a module at one site can access a module at another site. The module connection enabler 106 allows different test sites to have the same or different module configurations. In other words, each test site may employ different numbers and types of modules. Possible hardware implementations include dedicated connections, switch connections, bus connections, ring connections, and star connections. The module connection enabler 106 may be implemented by a switch matrix, for example. Each test site 110 is associated with a DUT 112, which is connected to the modules of the corresponding site through a loadboard 114. In another embodiment, a single site controller may be connected to multiple DUT sites.

The system controller 102 serves as the overall system manager. It coordinates the site controller activities, manages system-level parallel test strategies, and additionally provides for handler/probe controls as well as system-level data-logging and error handling support. The system controller 102 is the primary point of interaction for a test engineer in verifying and debugging the test environment. It provides a gateway to the site controllers 104, and manages the synchronization of the site controller activities in a multi-DUT environment. It further runs user applications and tools, such as the Datalog graphical user interface (DatalogGUI). Depending on the operational setting, the system controller 102 can be deployed on a CPU that is separate from the operation of site controllers 104. Alternatively a common CPU may be shared by the system controller 102 and the site controllers 104. Similarly, each site controller 104 can be deployed on its own dedicated CPU (central processing unit), or as a separate process or thread within the same CPU.

The site controllers 104 are responsible for running a test plan to test the DUTs. The test plan creates specific tests by using the Framework Classes as well as standard or user supplied Test Classes that encapsulate the test methodology. In addition, the test plan configures the hardware using the Standard Interfaces, and defines the test flow.

The system architecture of the present invention may be conceptually envisioned as the distributed system shown in FIG. 1 with the understanding that the individual system components may also be regarded as logical components of an integrated, monolithic system, and not necessarily as physical components of a distributed system. The plug-and-play or replaceable modules are facilitated by use of standard interfaces at both hardware and software levels. A tester operating system (TOS) allows a user to write test plan programs using a test plan programming language, and to operate the test system in a way specific to a particular device under test (DUT). It also allows the user to package sequences of the test system operations commonly used in test plan programs as libraries. These libraries are sometimes referred to as test classes and test templates.

Datalog Framework

The datalog framework runs on individual Site Controllers, along with the test plan and the system framework classes. It provides a set of interfaces, classes and methods to support the development, deployment and management of the datalog system. The datalog framework

- manages datalog elements, such as sources, streams and formatters;
- dispatches datalog events;
- provides an application programming interface (API) that allows the creation of new datalog events;
- provides APIs to set up and control datalogging;
- provides a general purpose formatter to handle common formatting needs; and
- provides support for the integration of modular third party and/or customer datalog services, which makes the datalog framework open.

Standard Datalog Interfaces

Figure 2:
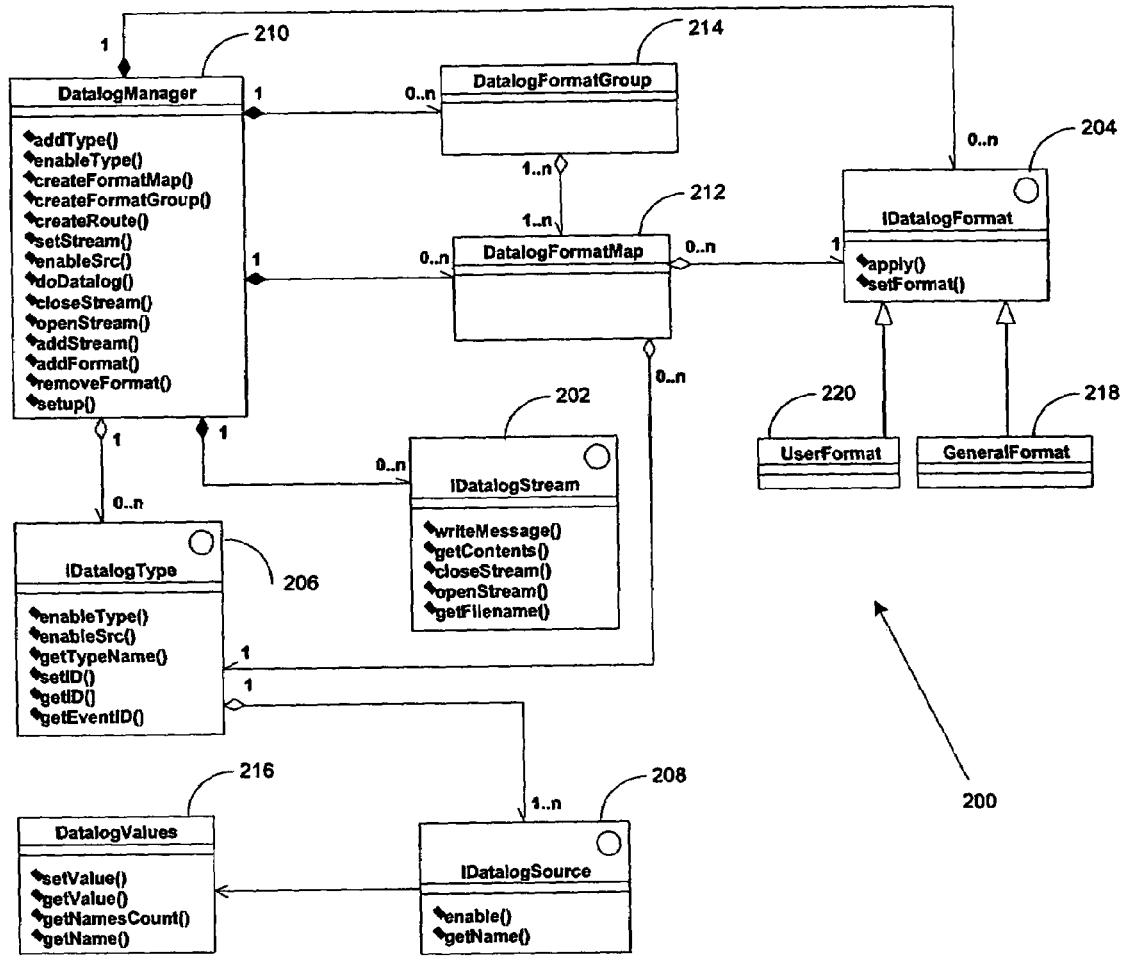
FIG. 2 illustrates an implementation of a datalog framework according to an embodiment of the present invention.

FIG. 2 illustrates an implementation of a datalog framework according to an embodiment of the present invention. The set of relationships among the datalog framework interfaces and support classes are illustrated through the unified modeling language (UML) class diagrams of FIG. 2. The datalog framework 200 includes a datalog stream interface 202, a datalog format interface 204, a datalog type interface 206, and a datalog source interface 208. The datalog framework 200 further includes a datalog manager class 210, a datalog format map class 212, a datalog format group class 214, a datalog values class 216, a general format class 218, and a user format class 220.

The standard datalog interfaces to the tester operating system (TOS) are defined as pure abstract C++ classes. The datalog stream interface (IDatalogStream) 202 represents an output file or device. The datalog system sends formatted output to streams. The system provides two built-in streams, a FileStream for sending output to a local disk file, and a ConsoleStream for sending output to the System's Console application.

The datalog format interface (IDatalogFormat) 204 represents the necessary instructions required to format data associated with datalog events to an output. The specific nature of the formatting capability is hidden inside each implementation of the IDatalogFormat. For example, the built-in GeneralFormat allows a general format string to be used with a macro-like capability for extracting named values from the DatalogValues objects, and inserting them into a formatted string.

The datalog type interface (IDatalogType) 206 represents a class or a "type" of datalog source, such as a particular type of a Test. The DatalogManager 210 maps events to formats and streams based in part on the type of the source of the event. As new types of sources are created, they register themselves with the DatalogManager 210 and receive an identifier (ID) value. Managing these types allows the DatalogManager 210 to enable/disable whole classes of datalog sources as well as specific instances of datalog sources. The IDatalogType objects 206 may generate multiple classes of datalog events. For example, a user test that loops over a set of patterns until some condition occurs may generate TestStart, TestEnd, IterationStart, IterationEnd, and ConditionTest datalog events. Each of these classes of events may have different data fields associated with it (see DatalogValues class below).

The datalog source interface (IDatalogSource) 208 represents a source of datalog events. While the IDatalogType 206 characterizes an entire class of datalog source objects, the IDatalogSource 208 represents an individual source instance. This interface allows enabling/disabling datalogging of individual sources.

Datalog Support Classes

A central object of the datalog framework 200 is the DatalogManager object 210. This object is responsible for maintaining all datalog output streams as well as formatting and forwarding datalog events and their associated data to the appropriate stream(s). The DatalogManager 210 resides in the test plan server (TPS) of the Site Controller. It is the datalog execution engine. Specifically, the main functions of the DatalogManager 210 include:

Managing a set of global datalog streams (i.e., objects implementing the IDatalogStream interface).

Managing a set of datalog formats (i.e., objects implementing the IDatalogFormat interface), each of which generates a formatted string as a result of a set of datalog events.

Distributing the datalog events to all associated datalog streams. All destinations for streams can be controlled through the DatalogManager.

Maintaining and controlling Datalog Mask conditions, which have the effect of filtering datalog output. Note that the application of the mask may occur at the source to improve system performance.

Starting up/cleaning up the datalog system.

Enabling/disabling the entire datalog system, as well as individual datalog types or sources.

The datalog format map class 212 is a named <EventType, EventName, Format> combination. That is, it groups together an EventType (representing a specific IDatalogType object), an EventName (representing one of the datalog events generated by EventType objects) and a Format (representing an IDatalogFormat object).

The datalog format group class 214 is a collection of DatalogFormatMap objects. Users may bundle DatalogFormatMap objects into a single group and assign the group to a stream or several streams. This provides the user-level control over the ultimate formatting of datalog events and the routing of these formatted strings to the appropriate streams.

The datalog values class 216 contains header information, like datalog type identifier and event, and a list of datalog fields that are set by the event source. The DatalogValues object acts as a string-to-string map, from name to value, allowing format objects to extract the required values by name, and insert them into a formatted stream.

The general format class 218 is an implementation of IDatalogFormat. It allows a general format string to be used with a macro-like capability for extracting named values from the DatalogValues objects, and inserting them into a formatted string.

The user format class 220 is a placeholder for a user-defined format class. If the supplied GeneralFormat class does not meet a user's specific requirements, one may add a new format class to the system and make use of it.

Datalog Sources

Figure 3:
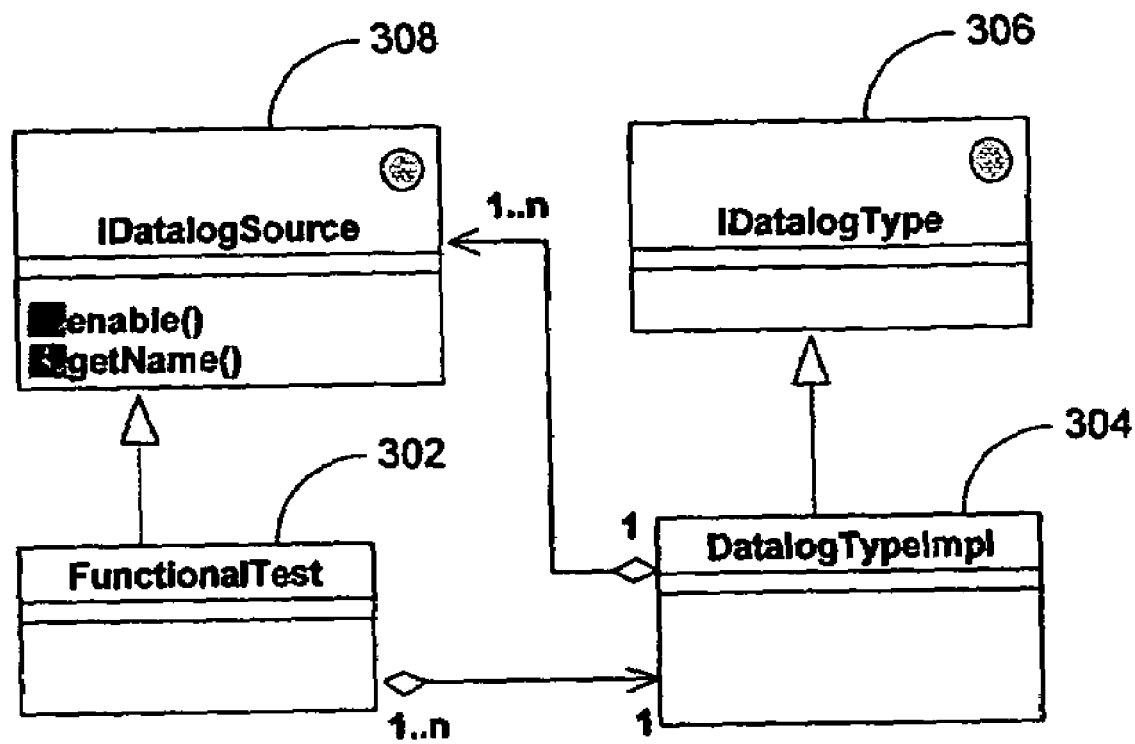
FIG. 3 illustrates an implementation of datalog sources according to an embodiment of the present invention.

In one embodiment, a Site Controller based object may act as a source of datalog events by implementing an IDatalogSource interface 208. For example, the Test Plan and Test objects are examples of sources of events. Each instance of such an object implements the IDatalogSource interface. In addition, each type of such an object, for example FunctionalTest, has an implementation of the IDatalogType interface 206 associated with it. This is accomplished with a class-wide static object for each type of datalog source. FIG. 3 illustrates an implementation of datalog sources according to an embodiment of the present invention. The datalog sources include a functional test ( ) class 302, a datalog type implementation ( ) class 304, the datalog type interface 306 and the datalog source interface 308.

As shown in FIG. 3, the FunctionalTest class 302 has a class-wide static member of type DatalogTypeImpl 304. An instance of the FunctionalTest checks this member variable when it is created. If the variable has not been created and assigned, then the constructor creates an instance of DatalogTypeImpl, initializes it, assigns it to the static member variable, and registers it with the DatalogManager. A subsequent instance of the FunctionalTest class accesses the DatalogTypeImpl data member, and adds itself (i.e., the instance of the FunctionalTest as an IDatalogSource) to DatalogTypeImpl's list of datalog source instances that the latter FunctionalTest instance is serving.

In another embodiment, a sub-class of the FunctionalTest class, for example ADifferentFunctionalTest, may attempt to establish a datalog type different from that of the FunctionalTest. An implementation of ADifferentFunctionalTest may accomplish this by not using the class-wide DatalogTypeImpl associated with the FunctionalTest, but using its own class-wide instance of a DatalogTypeImpl. Note that each instance of FunctionalTest implements the IDatalogSource interface. DatalogTypeImpl uses this interface to enable/disable individual sources.

Source Type Registration

When a Test Plan is loaded, datalog event sources may register with the DatalogManager object. The return value from this registration is an identifier, which is then used to generate events.

Figure 4:
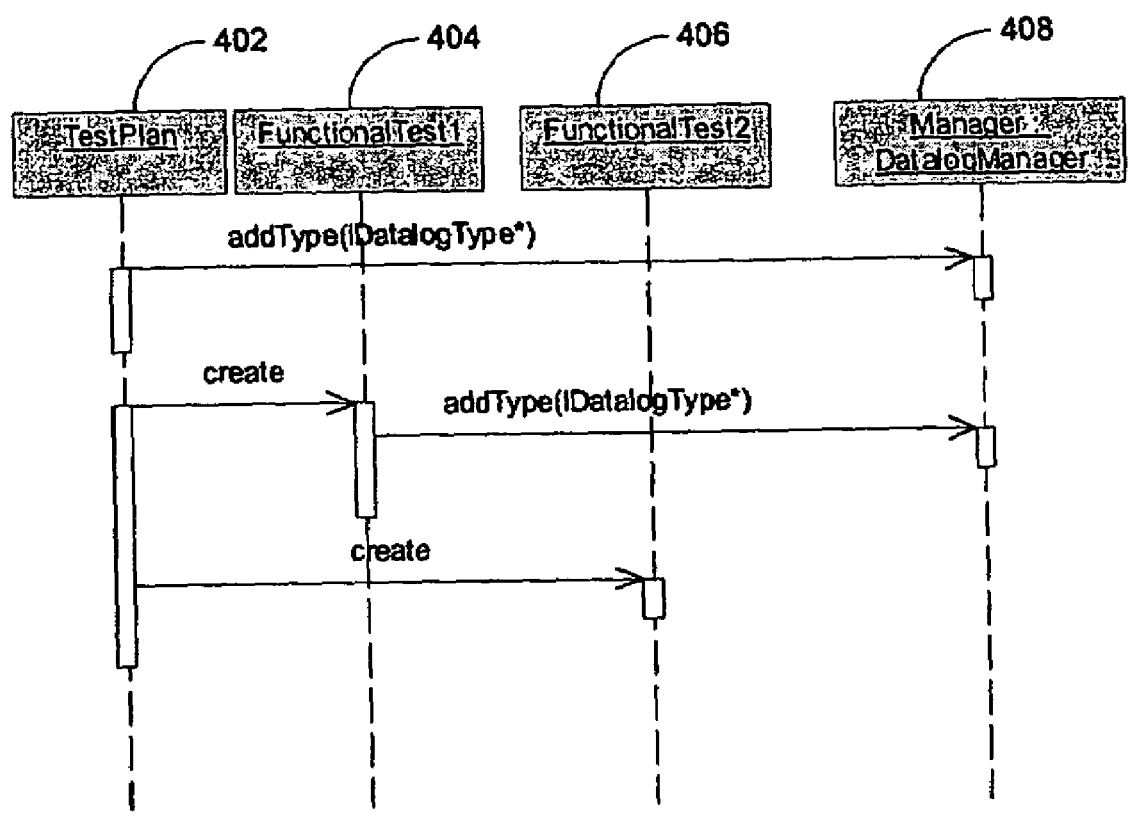
FIG. 4 illustrates a method for registering source types according to an embodiment of the present invention.

FIG. 4 illustrates a method for registering source types according to an embodiment of the present invention. The group of collaborating objects for registering source types includes a Test Plan object 402, a FunctionalTest1 object 404, a FunctionalTest2 object 406, and a DatalogManager object 408. Note that when the Test Plan creates two test instances of the same type (FunctionalTest1 and FunctionalTest2), the first test instance registers a new datalog type with the DatalogManager.

Users may set datalog formats for different event types. This may be done during Test Plan initialization to provide default formats and/or done interactively from remote applications. A similar procedure is followed to allow users to set the datalog streams. The DatalogManager maintains a mapping from a set of {datalog-type, datalog-event} to a corresponding set of {datalog-format, datalog-stream} that specifies the route an event of a particular type may take through the test system. For file-based streams, a Test class on the Site Controller may close the stream allowing the datalog file to be transferred to the System Controller. The stream may then be reopened or replaced with another stream.

Formatting and Streaming Data

Figure 5:
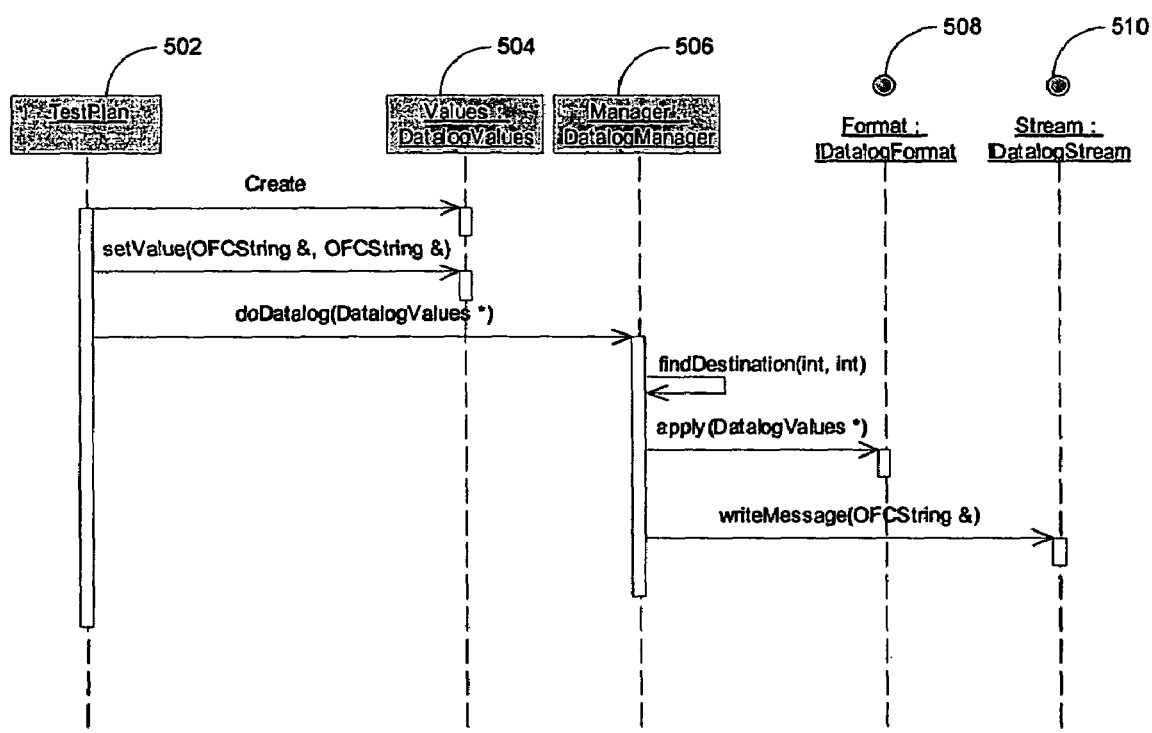
FIG. 5 illustrates a method for formatting and streaming data according to an embodiment of the present invention.

During testing, an object may generate a datalog event that is logged to a data stream. FIG. 5 illustrates a method for formatting and streaming data according to an embodiment of the present invention. The group of collaborating objects and interfaces for performing this task include a Test Plan object 502, a DatalogValues object 504, a DatalogManager object 506, a datalog format interface (IDatalogFormat) 508 and a datalog stream interface (IDatalogStream) 510. The Test Plan 502 creates the DatalogValues object instance 504, sets the appropriate values by calling the setvalue( ) method, and passes this object to the doDatalog( ) method of the Datalog-Manager 506. The doDatalog( ) method then finds the appropriate datalog format object 508 for the type/event combination, and calls the apply( ) method on this datalog format object 508 to obtain a string object in return. This string object is then passed to the associated datalog stream object 510 for output using the writeMessage( ) method.

Datalog Initialization

In a different embodiment, the datalog system is initialized using the following steps:
- create datalog stream(s) and add them to the DatalogManager.
- create datalog format(s) and add them to the DatalogManager.
- create datalog format map(s) and add them to the DatalogManager.
- create datalog format group(s) and add them to the DatalogManager.

The datalog application programming interface (API) provides functions to perform the above tasks. In addition, the test system provides a Test class, DatalogSetupTest, which reads one or more configuration files and performs the above steps. The example below illustrates the use of the DatalogSetupTest configuration file to perform the initialization steps. The DLL parameter within the datalog stream, datalog format map and datalog format group specifies a library to use for implementing the IDatalogStream 202 or IDatalogFormat 204.

```
Version 0.1.0;
# Enable the datalog system
Enabled;
# Step 1: Stream Creation
# Creates a stream of type FileStream, which logs the message to
# a file.
Stream FunctionalTestStream
{
    DLL "FileStream";
    FileName "FuncDatalogDut<DutID>.log";
    Overwrite "1";
}
# Step 2: Format Creation
# Adds a format with a line that looks like:
# Signal Info: $SignalInfo
# where $SignalInfo is replaced by the string provided in the datalog
source.
Format SignalInfoFormat
{
    DLL "GeneralFormat";
    Format "Signal Info: $SignalInfo";
} # Adds a format with a line that looks like:
# Test Result: $Result
# where $Result is replaced by the string provided in the datalog
# source.
Format TestResultFormat
```

-continued

```
{
    DLL "GeneralFormat";
    Format "Test Result: $Result";
}
# Step 3: FormatMap Creation
# Maps format SignalInfoFormat to event DumpSignal from sources
# of type com.Advantest.oai.TestClasses.FunctionalTest.
FormatMap SignalFormatMap
{
    Type com.advantest.oai.TestClasses.FunctionalTest;
    Event DumpSignal;
    Format SignalInfoFormat;
}
# Maps format TestResultFormat to event TestResult from sources
# of type com.Advantest.oai.TestClasses.FunctionalTest.
FormatMap ResultFormatMap
{
    Type com.advantest.oai.TestClasses.FunctionalTest;
    Event TestResult;
    Format TestResultFormat;
}
# Step 4: FormatGroup Creation
# Creates a group which directs messages from format map
# SignalFormatMap and ResultFormatMap to destination
# FunctionalTestStream and ConsoleStream.
FormatGroup FunctionalTestGroup
{
    FormatMap SignalFormatMap;
    FormatMap ResultFormatMap;
    Stream FunctionalTestStream;
    Stream ConsoleStream;
}
```

Semantics of Datalog Setup File

In yet another embodiment, a datalog setup file includes four different types of blocks: datalog format blocks, datalog stream blocks, datalog format map blocks and datalog format group blocks. These blocks are used to define the datalog formats, datalog streams, datalog format maps and datalog format groups respectively. Any of these four blocks may be used multiple times in a same setup file, and the datalog system may also be set up with multiple separate datalog setup files. Thus, the datalog system setup is modular and flexible. For example, there may be a first datalog setup file for setting up Cal/Diags datalogging, a second datalog setup file for setting up datalogging for functional tests, and a third datalog setup file for setting up datalogging for parametric tests.

Datalog Format Block

In one embodiment, a datalog format block is used to define a datalog format. The definitions of the format may include a format name, a format DLL name, a message format string and optional user-defined format parameters. If the format DLL name is GeneralFormat, the predefined GeneralFormat is used; otherwise, a user-defined datalog format is used. In the latter case, the user provides a datalog format DLL in the system test directories. The following Datalog API is called to define the datalog format block:

void DatalogManager::addFormat(const OFCString &formatName,
   const OFCString &typeName,
   const OFCString &format,
   const DatalogProperties_t properties); and
Format SignalInfoFormat
{
    DLL "GeneralFormat";
    Format "$SignalInfo";
} defines a format SignalInfoFormat, which makes use of the predefined GeneralFormat. Its format string is $SignalInfo, in which $SignalInfo is a token which may be replaced by the datalog variable SignalInfo in the passed-in datalog record (DatalogValues) during runtime. A datalog format block can be used to remove an existing datalog format from the datalog system. In this scenario, the following datalog API is called.

void DatalogManager::removeFormat(const OFCString &formatName); and

Format AnExistingFormat Disabled;

removes datalog format AnExistingFormat from the datalog system.

Datalog Stream Block

In another embodiment, a datalog stream block is used to define a datalog stream. The definition of the datalog stream includes a stream name, a stream DLL name and optional user-defined stream parameters. If the stream DLL name is FileStream or ConsoleStream, a built-in datalog stream FileStream or ConsoleStream is used; otherwise, a user-defined datalog stream is used. In the latter case, the user provides a datalog stream DLL in the system test directories. The following Datalog API is called to define the datalog stream block:

```
void DatalogManager::addStream(const OFCString &streamName,
    const OFCString &typeName,
    const DatalogProperties_t properties);
and
    Stream FunctionalTestStream
    {
        DLL "FileStream";
        FileName "datalog<DutID>.log";
        Overwrite "0";
    }
``` defines a stream FunctionalTestStream, which makes use of the built-in stream FileStream with optional parameter FileName and Overwrite. Note that FileStream supports a file name with automatic variables <DutID> and <TimeStamp>. The <DutID> is replaced by the current DUT ID during runtime while the <TimeStamp> is replaced by the current date and time with format such as Thu_Nov_13_06_40_28_2003.

A datalog stream block can be used to remove an existing datalog stream from the datalog system. In this case, the following datalog API is called:

void DatalogManager::removeStream(const OFCString &streamName); and

Stream AnExistingStream Disabled;

removes datalog stream AnExistingStream from the datalog system.

Datalog Type Block

In a different embodiment, a datalog type block is used to define user-specific properties for a datalog type. The following Datalog API is called to define the datalog type block:

```
IDatalogType *DatalogManager::getType(const OFCString &typeName) const;
void IdatalogType::addProperty(const OFCString &propName,
    const OFCString &propValue);
and
    Type com.Advantest.oai.TestClasses.FunctionalTest
```

-continued

```
    {
        Mode "Detailed";
    }
``` defines a property Mode with value "Detailed" for datalog type "com.Advantest.oai.TestClasses.FunctionalTest."

Datalog Format Map Block

In yet another embodiment, a datalog format map block is used to define a datalog format map. The definition of the Format Map includes a format map name, a datalog type name and its event name to be mapped, and a mapped format name. The following Datalog API is called to define the datalog format map block:

```
void DatalogManager::createFormatMap(const OFCString &mapName,
    const OFCString &typeName,
    const OFCString &eventName,
    const OFCString &formatName);
and
    FormatMap SignalFormatMap
    {
        Type com.Advantest.oai.TestClasses.FunctionalTest;
        Event DumpSignal;
        Format SignalInfoFormat;
    }
``` defines a format map SignalFormatMap, which maps datalog type com.Advantest.oai.TestClasses.FunctionalTest and its event DumpSignal to format SignalInfoFormat.

A datalog format map block may be used to remove an existing datalbg format map from the datalog system. In this case, the following datalog API void DatalogManager::removeFormatMap(const OFCString &mapName);

is called to perform the task.

Datalog Format Group Block

In one embodiment, a datalog format block is used to define a datalog format group. The definition of the Format Group includes a format group name, a list of names of format maps that the format group contains, and a list of names of streams to which messages generated from the format group are exported. The following Datalog APIs are called to define the datalog format group block:

```
void DatalogManager::createFormatGroup(const OFCString &groupName,
    const OFCStringVec_t &mapNames);
void DatalogManager::setStream(const OFCString &groupName,
    const OFCString &streamName);
```

The first call creates a format group that contains a vector of formats, and the second call adds a datalog stream into the created format group. For example, FormatGroup FunctionalTestGroup

```
    {
        FormatMap SignalFormatMap;
        FormatMap ResultFormatMap;
        Stream FunctionalTestStream;
```

```
    Stream ConsoleStream;
}
``` defines a format group FunctionalTestGroup, which includes a format map SignalFormatMap and a ResultFormatMap. The messages generated from the format group are exported to datalog stream FunctionalTestStream and ConsoleStream.

A datalog format map block may be used to remove an existing datalog format group from the datalog system. In this case, the datalog API void DatalogManager::removeFormatGroup(const OFCString &groupName);

is called to perform the function.

Datalog System Application Examples

In the following examples, proxy objects, such as DatalogManagerProxy, DatalogHandelerProxy, and DatalogFilterProxy, are used by applications running the system controller to remotely control the current state and operation of the datalog framework on one or more site controllers. These objects act as remote proxies for the real objects on the site controllers and provide a transparent communication channel to these objects that allows applications on the system controller to deal with local object rather than the complexities of communication protocols.

Figure 6:
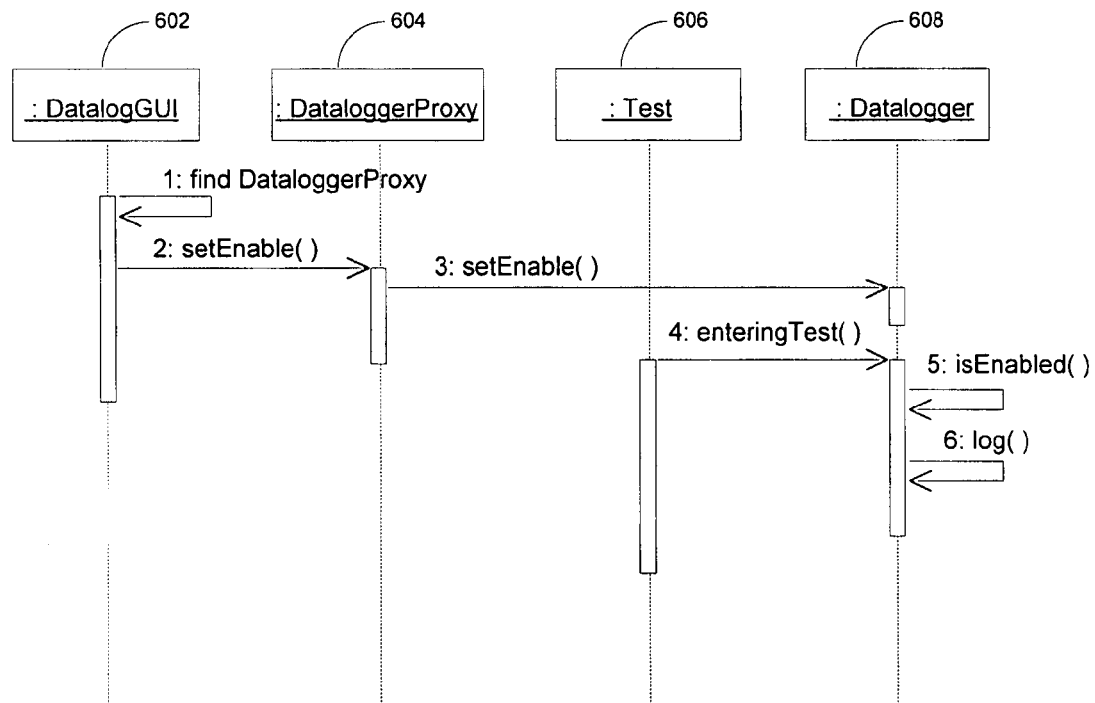
FIG. 6 illustrates an implementation of enabling datalogging dynamically according to an embodiment of the present invention.

FIG. 6 illustrates an implementation of enabling datalogging dynamically according to an embodiment of the present invention. The group of collaborating objects for achieving this task includes a Datalog graphical user interface (DatalogGUI) object 602, a DataloggerProxy object 604 (also referred to as DatalogManagerProxy), a test object 606 and a Datalogger object 608 (also referred to as DatalogManager). The sequence diagram illustrates the steps for enabling a datalog system dynamically. As shown in FIG. 6, each step of the sequence diagram is described as follows:

1. In step 1, the DatalogGUI 602 or other tester GUI (e.g., Test Control Panel) includes a button or menu item Enable Datalog. When a user clicks on the button or menu item, the DatalogGUI 602 searches the DataloggerProxy object 604 from a test plan server proxy (TPSProxy).
2. The DatalogGUI 602 invokes a setEnable( ) method on the returned DataloggerProxy 604, passing in parameter value 'true', which means enabling the datalog system.
3. With the proxy model, the setEnable( ) method of the DataloggerProxy 604 invokes the setEnableTest( ) method of the Datalogger 608 to enable the datalog system.
4. The test object 606 calls an enteringTest( ) method to send out a datalog event to the Datalogger 608.
5. The Datalogger 608 checks whether it is enabled by calling an isEnabled( ) method.
6. If the Datalogger 608 is enabled, it invokes a log( ) method to start datalogging.

Figure 7:
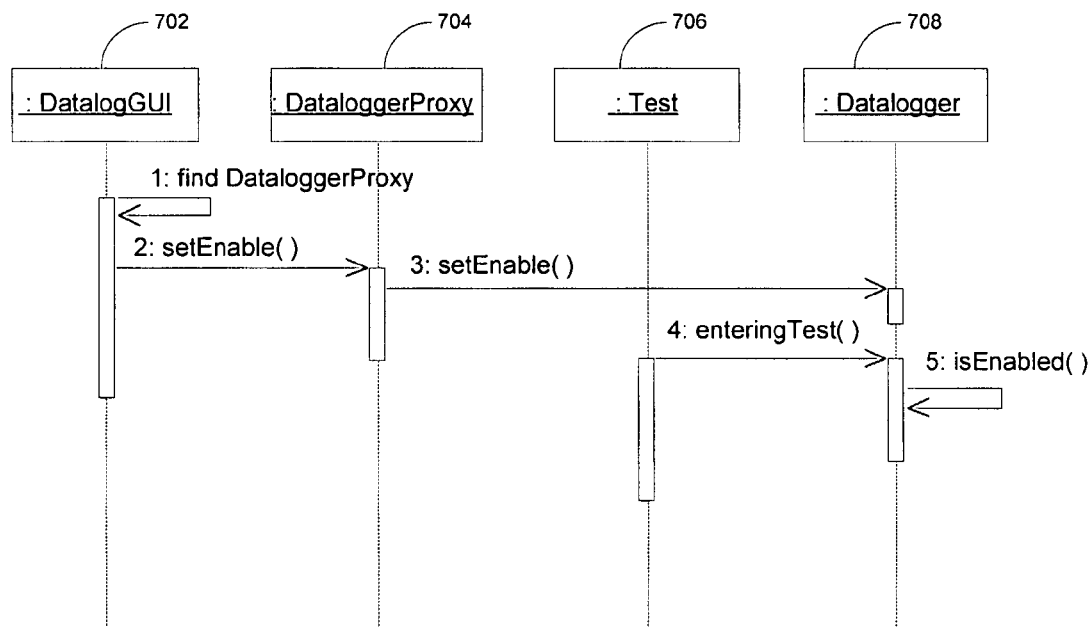
FIG. 7 illustrates an implementation of disabling datalogging dynamically according to an embodiment of the present invention.

FIG. 7 illustrates an implementation of disabling datalogging dynamically according to an embodiment of the present invention. The group of collaborating objects for achieving this task includes a DatalogGUI object 702, a DataloggerProxy object 704, a test object 704 and a Datalogger object 708. The Datalogger 708 may be used to disable all datalogging. The sequence diagram illustrates the steps for disabling a datalog system dynamically. As shown in FIG. 7, each step of the sequence diagram is described as follows:

1. In step 1, the DatalogGUI 702 or other tester GUI (e.g., Test Control Panel) includes a button or menu item Disable Datalog. When a user clicks on the button or menu item, DatalogGUI searches the singleton DataloggerProxy object 704 from a TPSProxy.
2. The DatalogGUI 702 invokes a setEnable( ) method on the returned DataloggerProxy 704, passing in parameter value 'false', which means disabling the datalog system.
3. With the proxy model, the setEnable( ) method of the DataloggerProxy 704 invokes the setEnableTest( ) method of the Datalogger 708 to disable the datalog system.
4. The test object 706 calls an enteringTest( ) method to send out a datalog event to the Datalogger 708.
5. The Datalogger checks whether it is enabled. Since it is disabled, no datalogging may occur.

Figure 8:
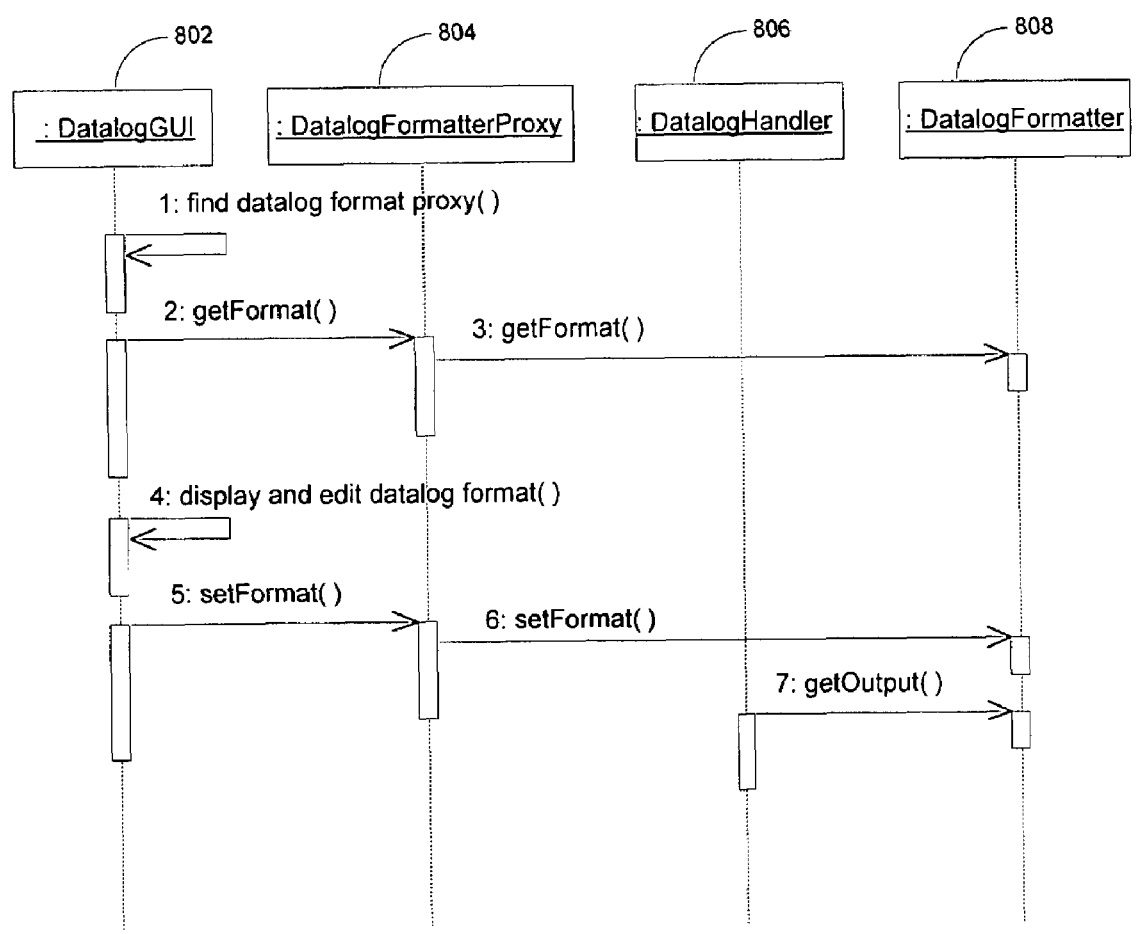
FIG. 8 illustrates an implementation of modifying datalog format dynamically according to an embodiment of the present invention.

FIG. 8 illustrates an implementation of modifying datalog format dynamically according to an embodiment of the present invention. The group of collaborating objects for achieving this task includes a DatalogGUI object 802, a DatalogFormatterProxy object 804, a DatalogHandler object 806, and a DatalogFormatter object 808. The sequence diagram illustrates the steps for changing the datalog format dynamically. The DatalogHandler object 806 allows users to combine datalog stream and format specifications together in a single entitle that the DatalogManager may use to pass datalog events to. As shown in FIG. 8, each step of the sequence diagram is described as follows:

1. In step 1, the DatalogGUI 802 displays a list of available datalog formatters associated with a selected datalog handler. A user may select any datalog formatter by opening a pull-down menu, and selects the menu item Edit. The implementation of DatalogGUI associates each datalog formatter item in the list with the corresponding datalog formatter proxy reference (by using user data parameter). Next, the DatalogFormatterProxy object 804 is obtained.
2. The DatalogGUI 802 invokes a getFormat( ) method using the DatalogFormatterProxy object 804 to get the format string and related arguments.
3. With the proxy model, the getFormat( ) method of the DatalogFormatterProxy 804 invokes the corresponding getFormat( ) method of the DatalogFormatter 808.
4. The DatalogGUI 802 displays the format and argument of the datalog event with the selected formatter. The user may change the format and argument according to a set of predetermined datalog format requirements.
5. When the user applies the modified formatter into the datalog system, the DatalogGUI 802 invokes a setFormat( ) method of the DatalogFormatterProxy 804 and passes in the modified format string and arguments.
6. With the proxy model, DatalogFormatterProxy.setFormat( ) method of the DatalogFormatterProxy 804 invokes the corresponding setFormat( ) method of the DatalogFormatter 808.
7. Next, when the DatalogHandler 806 invokes a getOuptut( ) method on the modified datalog formatter to get formatted message with the datalog event, the modified formatter is applied.

Figure 9:
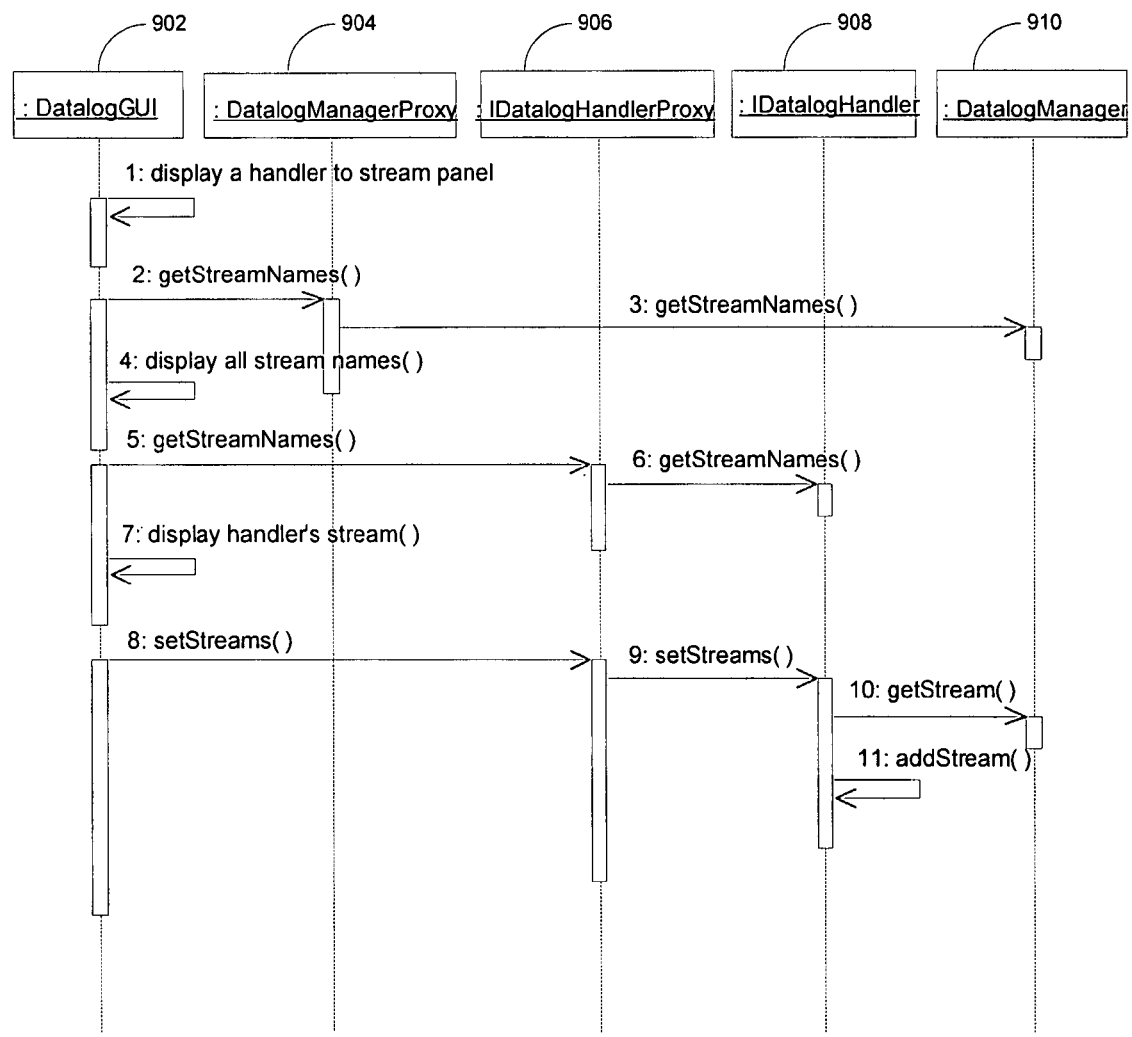
FIG. 9 illustrates an implementation of assigning datalog output streams dynamically according to an embodiment of the present invention.

FIG. 9 illustrates an implementation of assigning datalog output streams dynamically according to an embodiment of the present invention. The group of collaborating objects for achieving this task includes a DatalogGUI object 902, a DatalogManagerProxy object 904, a IDatalogHandlerProxy object 906, a IDatalogHandler object 908, and a DatalogManager object 910. The sequence diagram illustrates the steps for assigning datalog output streams to associate with a datalog handler dynamically. As shown in FIG. 9, each step of the sequence diagram is described as follows:

1. In step 1, when a user selects a datalog handler to edit its associated datalog output stream, the DatalogGUI 902 displays a panel, which comprises two lists: a first list displays datalog stream names in the datalog system, and a second list displays the datalog stream names associated with the datalog handler. In addition, the DatalogGUI also includes Add, Remove, Apply, OK and Cancel buttons.
2. The DatalogGUI 902 calls a getStreamNames( ) method of the DatalogManagerProxy 904.
3. With the proxy model, the getStreamNames( ) method of the DatalogManagerProxy 904 invokes the corresponding getStreamNames( ) method of the DatalogManager 910 to get all datalog stream names registered in the datalog system.
4. The DatalogGUI 902 displays the retrieved datalog stream names in the first list.
5. The DatalogGUI 902 then calls a getStreamNames( ) method of the IDatalogHandlerProxy 906.
6. With the proxy model, the corresponding getStreamNames( ) method of the IDatalogHandlerProxy 906 invokes the corresponding getStreamNames( ) method of the IDatalogHandler 908 to get all datalog stream names currently associated with the selected datalog handler.
7. The DatalogGUI 902 displays the retrieved datalog stream names associated with the selected datalog handler in the second list.
8. Then, the user edits the associated datalog stream list using the buttons Add and Remove. After the user finishes editing and clicks an Apply or Ok button to apply the modified stream to the datalog system, the DatalogGUI 902 invokes a setStreams( ) method on the IDatalogHandlerProxy 906 and passes to it the modified datalog stream names.
9. With the proxy model, the setStreams( ) method of the IDatalogHandlerProxy 906 invokes the corresponding setStreams( ) method of the IDatalogHandler 908.
10. Then, the DatalogHandler 908 gets the associated datalog stream object reference for each datalog stream name from the DatalogManager 910.
11. The IDatalogHandler 908 then adds the stream into the stream vector. Afterwards, the IDatalogHandler 908 sends out newly selected datalog streams in the stream vector for its datalog output.

Figure 10:
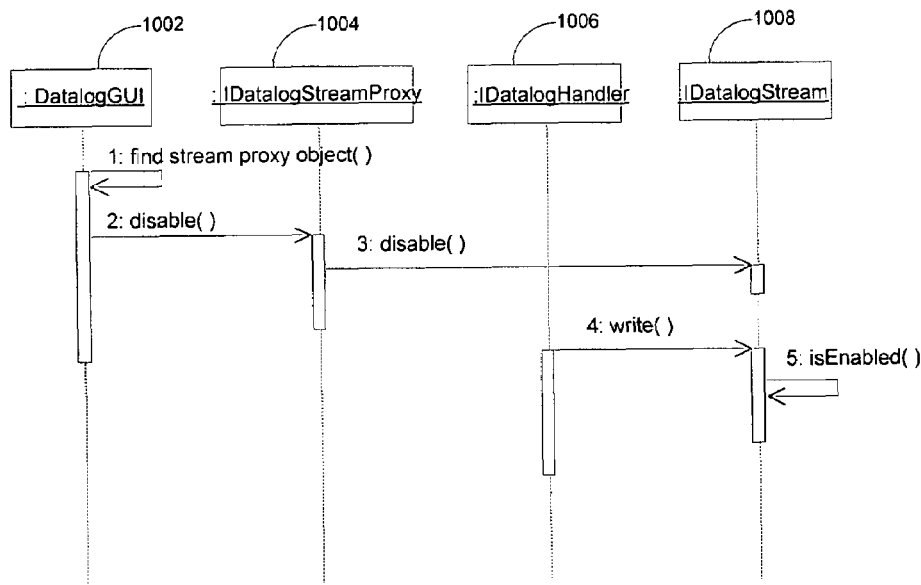
FIG. 10 illustrates an implementation of disabling datalog output stream dynamically according to an embodiment of the present invention.

FIG. 10 illustrates an implementation of disabling datalog output stream dynamically according to an embodiment of the present invention. The group of collaborating objects for achieving this task includes a DatalogGUI object 1002, a IDatalogStreamProxy object 1004, a IDatalogHandler object 1006 and a IDatalogStream object 1008. The sequence diagram illustrates the steps for disabling a datalog output stream dynamically. As shown in FIG. 10, each step of the sequence diagram is described as follows:

1. In step 1, the DatalogGUI 1002 displays a list of available datalog streams. A user may select any datalog stream by opening a pull-down menu, and selects a menu item Disable. The implementation of the DatalogGUI 1002 associates each datalog stream item in the list with the corresponding IDatalogStreamProxy reference 1004 (by using user data parameter). Then, the IDatalogStreamProxy 1004 is obtained.
2. The DatalogGUI 1002 invokes a disables method on the IDatalogStreamProxy object 1004 obtained.
3. The disable( ) method of the IDatalogStreamProxy 1004 invokes the corresponding disable( ) method of the IDatalogStream 1008 through the proxy model.
4. The IDatalogHandler 1006 calls a write( ) method to write out a formatted message to the stream.
5. The IDatalogStream 1008 checks whether it is enabled. If it is enabled, the output stream may be modified.

Figure 11:
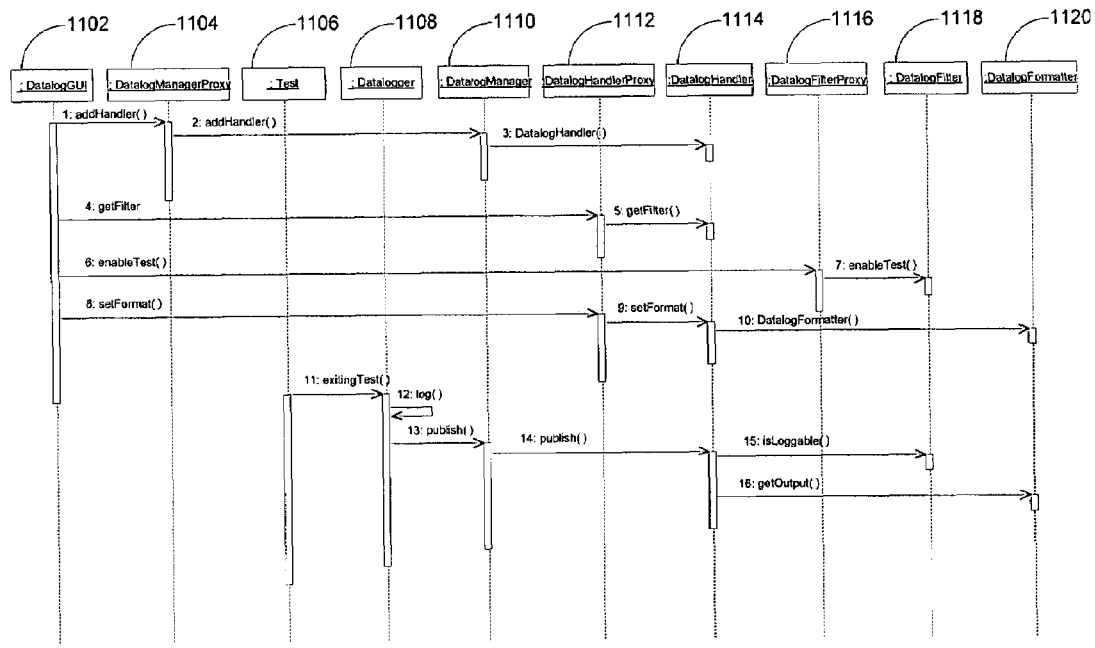
FIG. 11 illustrates an implementation of adapting new source dynamically according to an embodiment of the present invention.

FIG. 11 illustrates an implementation of adapting new source dynamically according to an embodiment of the present invention. The group of collaborating objects for achieving this task includes a DatalogGUI object 1102, a DatalogManagerProxy object 1104, a test object 1106, a Datalogger object 1108, a DatalogManager object 1110, a DatalogHandlerProxy object 1112, a DatalogHandler object 1114, a DatalogFilterProxy object 1116, a DatalogFilter object 1118, and a DatalogFormatter object 1120. The sequence diagram illustrates the steps for adapting new source dynamically. The DatalogFilter object 1118 allows users to selectively filter datalog events by type and source identifiers. This filtering allows users to turn on and off specific datalog events. As shown in FIG. 11, each step of the sequence diagram is described as follows:

1. In step 1, the DatalogGUI 1102 finds the DatalogManagerProxy object 1104, and calls its addHandler( ) method to register a new DatalogHandler instance for the new source. Note that in this approach, the DatalogHandler 1114 associates an event with a different Datalog Formatter. With this model, a new DatalogHandler instance is created to work with the new source (test class). The newly created DatalogHandlerProxy instance is returned.
2. With the proxy model, the addHandler( ) method of the DatalogManagerProxy 1104 invokes the corresponding addHandler( ) method of the DatalogManager 1110.
3. Next, the addHandler( ) method of the DatalogManager 1110 creates a new instance of DatalogHandler, then it registers the newly created DatalogHandler instance to the DatalogManager 1110.
4. Then, the DatalogGUI 1102 associates the datalog filter proxy with the newly created datalog handler through the DatalogHandlerProxy 1104 returned in step 1.
5. With the proxy model, the getFilter( ) method of the DatalogHandlerProxy 1112 invokes the corresponding getFilter( ) method of the DatalogHandler 1114.
6. With the DatalogFilterProxy 1116, the DatalogGUI 1102 calls its enableTest( ) method.
7. With the proxy model, the enableTest( ) method of the DatalogFilterProxy 1116 invokes the corresponding enableTest( ) method of the DatalogFilter 1118. As a result, the newly created datalog handler instance handles a selected event of the new test source.
8. The DatalogGUI 1102 sets the formats for each selected datalog event of the newly created datalog handler through its proxy. For this new test source, the format of a new argument may be specified as Test.FooArgument. In the new test source, an interface IProperty may be implemented, which is shown as follows:

```
class IProperty
{
   public:
        OFCString &getProperty(const OFCString &name) const;
        void setProperty(const OFCString &name, const OFCString
        *value);
        OFCStringVec_t getPropertyNames( ) const;
```

-continued

```
};
```
where FooArgument is one of the properties in the new test source.

9. The DatalogHandlerProxy 1112 calls a setFormato method thought the corresponding DatalogHandler 1114.
10. The DatalogHandler 1114 creates a DatalogFormatter for the selected event and adds it into the event route map. Next, the newly created datalog handler processes the datalog event from the new source. Then, the test plan with the new source test may start.
11. Once the TPS reaches the end of execution of the new source test, it sends an exitingTest( ) datalog request to the datalog system.
12. The Datalogger 1108 accepts the request, and transfers it to the datalog event to be logged.
13. The Datalogger 1108 forwards the new datalog event to the DatalogManager 1110 to dispatch.
14. The DatalogManager 1110 publishes the event to the registered datalog handlers one by one. Once a datalog handler is able to process the event, the publishing process may be stopped.
15. When the event is published to each datalog handler, the handler checks whether the event is loggable. The event is loggable if the newly created DatalogHandler instance is able to service the new test source.
16. The DatalogHandler 1114 finds the DatalogFormatter 1120 associated with the current event, and calls its getOuptut( ) method to get the formatted message based on the defined format. The getOuptut( ) method fetches the new parameter Test.FooArgument value by calling event.getDatalogger–>getTest( )–>getProperty ("FooArgument");
    the formatted output message is then forwarded to the output datalog stream.

There are number of benefits achieved by the disclosed datalog framework. First, the datalog framework is independent of the sources, nature and contents of the datalog events. This allows new datalog sources and events to be added without modifying the datalog framework. In addition, the formatting of datalog output is independent of the datalog framework. While the GeneralFormat is provided with the system, it is specified as a dynamically linked library (DLL) parameter to the Format block, and it is not "hard-coded" into the framework. Moreover, the formatting of datalog events is configurable by the end user. For example, events may be formatted into human readable text, comma-separated values for spreadsheets or databases, application-specific text or binary formats for further processing, or they may even be ignored entirely. The datalog framework is independent of the destination of datalog streams. Furthermore, formats and output streams are extendable. That is, users may add new IDatalogFormat and IDatalogStream implementations to the system without modifying the framework. Test classes (and other datalog sources) and their corresponding datalog events are also extendable so the framework does not need to know about specific source or event types. As users add new Test classes with new datalog event types, no modification of the datalog framework is required.

One skilled in the relevant art will recognize that many possible modifications of the disclosed embodiments may be used, while still employing the same basic underlying mechanisms and methodologies. The foregoing description, for purpose of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and its practical applications, and to enable others skilled in the art to best utilize the invention and various embodiments with various modifications as are suited to the particular use contemplated.

What is claimed is:

1. A method for communicating test information from a source to a destination, comprising:
    providing a modular test system, wherein the modular test system comprises a system controller for controlling at least one site controller, the at least one site controller for controlling at least one test module;
    providing a datalog framework for supporting extension of user-defined datalog formats;
    providing one or more support classes for supporting user-initiated datalog events;
    receiving a datalog event request for communicating input test information from the source to the destination;
    configuring output test information in accordance with the destination, the datalog framework and the one or more support classes; and
    transferring the output test information to the destination, and
    wherein the one or more support classes comprises at least one of:
    a datalog value class for storing header, type and event information;
    a datalog format map class for combining a type and a name of a user event;
    a datalog format group class for bundling a group of format maps;
    a user format class for supporting user-defined format classes; and
    a general format class for supporting a set of predefined format classes.

2. The method of claim 1, wherein the datalog framework is independent of the source and contents of the input test information communicated from the source to the destination.

3. The method of claim 1, wherein the datalog framework is independent of the destination and contents of the output test information transferred to the destination.

4. The method of claim 1, wherein formats of the output test information are configurable by users.

5. A method for communicating test information from a source to a destination, comprising:
    providing a modular test system, wherein the modular test system comprises a system controller for controlling at least one site controller, the at least one site controller for controlling at least one test module;
    providing a datalog framework for supporting extension of user-defined datalog formats;
    providing one or more support classes for supporting user-initiated datalog events;
    receiving a datalog event request for communicating input test information from the source to the destination;
    configuring output test information in accordance with the destination, the datalog framework and the one or more support classes; and
    transferring the output test information to the destination, and
    wherein the datalog framework comprises:

a source interface for supporting the input test information of individual sources from different vendors;
a type interface for representing classes of datalog sources and destinations;
a format interface for providing formatting capabilities;
a stream interface for transferring formatted test information to different destinations; and
a datalog manager for managing datalog events in response to the corresponding sources, streams, formats and destinations.

6. A method for communicating test information from a source to a destination, comprising:
providing a modular test system, wherein the modular test system comprises a system controller for controlling at least one site controller, the at least one site controller for controlling at least one test module;
providing a datalog framework for supporting extension of user-defined datalog formats;
providing one or more support classes for supporting user-initiated datalog events;
receiving a datalog event request for communicating input test information from the source to the destination;
configuring output test information in accordance with the destination, the datalog framework and the one or more support classes; and
transferring the output test information to the destination, and
wherein the step of providing the datalog framework further comprises:
creating one or more datalog streams;
creating one or more user formats;
creating one or more datalog format maps;
creating one or more datalog format groups; and
linking the one or more datalog streams, user formats, datalog format maps and datalog format groups to a corresponding datalog manager.

7. A method for communicating test information from a source to a destination, comprising:
providing a modular test system, wherein the modular test system comprises a system controller for controlling at least one site controller, the at least one site controller for controlling at least one test module;
providing a datalog framework for supporting extension of user-defined datalog formats;
providing one or more support classes for supporting user-initiated datalog events;
receiving a datalog event request for communicating input test information from the source to the destination;
configuring output test information in accordance with the destination, the datalog framework and the one or more support classes; and
transferring the output test information to the destination, and
wherein the step of configuring comprises:
creating a datalog value object, the datalog value object including type and event information;
determining a datalog format object based upon the corresponding destination, datalog framework and one or more support classes; and
formatting the output test information using the datalog format object.

8. A modular test system, comprising:
a system controller;
at least one site controller coupled to the system controller;
at least one test module and the corresponding device under test (DUT);
a datalog framework configured to support extension of user-defined datalog formats;
one or more support classes configured to support user-initiated datalog events;
means for receiving a datalog event request for communicating input test information from a source to a destination;
means for configuring output test information in accordance with the destination, the datalog framework and the one or more support classes; and
means for transferring the output test information to the destination, and
wherein the one or more support classes comprises at least one of;
a datalog values class for storing header, type and event information;
a datalog format map class for combining a type and a name of a user event;
a datalog format group class for bundling a group of format maps;
a user format class for supporting user-defined format classes; and
a general format class for supporting a set of predefined format classes.

9. The system of claim 8, wherein the datalog framework is independent of the source and contents of the input test information communicated from the source to the destination.

10. The system of claim 8, wherein the datalog framework is independent of the destination and contents of the output test information transferred to the destination.

11. The system of claim 8, wherein formats of the output test information transferred to the destination are configurable by users.

12. A modular test system, comprising:
a system controller;
at least one site controller coupled to the system controller;
at least one test module and the corresponding device under test (DUT);
a datalog framework configured to support extension of user-defined datalog formats;
one or more support classes configured to support user-initiated datalog events;
means for receiving a datalog event request for communicating input test information from a source to a destination;
means for configuring output test information in accordance with the destination, the datalog framework and the one or more support classes; and
means for transferring the output test information to the destination, and
wherein the datalog framework comprises:
a source interface for supporting the input test information of individual sources from different vendors;
a type interface for representing classes of datalog sources and destinations;
a format interface for providing formatting capabilities;
a stream interface for transferring formatted test information to different destinations; and
a datalog manager for managing datalog events in response to the corresponding sources, streams, formats and destinations.

13. A modular test system, comprising:
a system controller;
at least one site controller coupled to the system controller;
at least one test module and the corresponding device under test (DUT);

a datalog framework configured to support extension of user-defined datalog formats;

one or more support classes configured to support user-initiated datalog events;

means for receiving a datalog event request for communicating input test information from a source to a destination;

means for configuring output test information in accordance with the destination, the datalog framework and the one or more support classes; and means for transferring the output test information to the destination, and wherein the datalog framework further comprises:

means for creating one or more datalog streams;

means for creating one or more user formats;

means for creating one or more datalog format maps;

means for creating one or more datalog format groups; and means for linking the one or more datalog streams, user formats, datalog format maps and datalog format groups to a corresponding datalog manager.

14. A modular test system, comprising:

a system controller;

at least one site controller coupled to the system controller;

at least one test module and the corresponding device under test (DUT);

a datalog framework configured to support extension of user-defined datalog formats;

one or more support classes configured to support user-initiated datalog events;

means for receiving a datalog event request for communicating input test information from a source to a destination;

means for configuring output test information in accordance with the destination, the datalog framework and the one or more support classes; and means for transferring the output test information to the destination, and wherein the means for configuring output test information comprises:

means for creating a datalog value object, the datalog value object including type and event information;

means for determining a datalog format object based upon the corresponding destination, datalog framework and one or more support classes; and means for formatting the output test information using the datalog format object.

* * * * *